(12) United States Patent
Kossor et al.

(10) Patent No.: US 7,856,105 B2
(45) Date of Patent: Dec. 21, 2010

(54) APPARATUS AND METHOD FOR PROCESSING OF AMPLIFIER LINEARIZATION SIGNALS

(75) Inventors: Michael G. Kossor, Kenilworth, NJ (US); Michael Rauh, Canal Winchester, OH (US)

(73) Assignee: Andrew LLC, Hickory, NC (US)

( * ) Notice: Subject to any disclaimer, the term of this patent is extended or adjusted under 35 U.S.C. 154(b) by 1266 days.

(21) Appl. No.: 11/371,543

(22) Filed: Mar. 9, 2006

(65) Prior Publication Data
US 2007/0222513 A1 Sep. 27, 2007

(51) Int. Cl.
*H04H 40/54* (2008.01)
(52) U.S. Cl. .............................. 381/4; 700/94; 330/151; 381/120; 455/114.3
(58) Field of Classification Search .................. 381/1–4, 381/57, 28, 94.1–94.8, 120; 455/114.2, 130, 455/296, 297, 114.3, 115.1, 278.1, 283; 330/151, 52, 129, 127; 700/94
See application file for complete search history.

(56) References Cited

U.S. PATENT DOCUMENTS

| | | | | |
|---|---|---|---|---|
| 3,443,229 | A | * 5/1969 | Becker | ........................ 375/261 |
| 4,389,618 | A | 6/1983 | Bauman | |
| 5,485,120 | A | 1/1996 | Anvari | |
| 5,576,659 | A | 11/1996 | Kenington et al. | |
| 5,594,385 | A | 1/1997 | Anvari | |
| 5,610,554 | A | 3/1997 | Anvari | |
| 5,748,677 | A | 5/1998 | Kumar | |
| 5,850,162 | A | 12/1998 | Danielsons | |
| 5,923,214 | A | * 7/1999 | Mitzlaff | ........................ 330/52 |
| 5,959,500 | A | 9/1999 | Garrido | |
| 5,990,734 | A | 11/1999 | Wright et al. | |
| 6,087,898 | A | 7/2000 | Baskin | |
| 6,091,297 | A | 7/2000 | Bar-David et al. | |
| 6,092,919 | A | 7/2000 | Calise et al. | |
| 6,133,789 | A | 10/2000 | Braithwaite | |
| 6,160,996 | A | 12/2000 | Blodgett et al. | |
| 6,169,450 | B1 | 1/2001 | Gentzler | |
| 6,208,207 | B1 | 3/2001 | Cavers | |
| 6,246,286 | B1 | 6/2001 | Persson | |
| 6,275,105 | B1 | 8/2001 | Ghannouchi et al. | |
| 6,285,252 | B1 | 9/2001 | Huang | |
| 6,292,054 | B1 | 9/2001 | Ma et al. | |
| 6,294,956 | B1 | 9/2001 | Ghanadan | |
| 6,340,914 | B1 | 1/2002 | Gavrilovic | |
| 6,353,360 | B1 | 3/2002 | Hau et al. | |
| 6,359,508 | B1 | 3/2002 | Muccenieks | |
| 6,396,344 | B1 | 5/2002 | Gentzler et al. | |
| 6,414,546 | B2 | 7/2002 | Cavers | |
| 6,437,641 | B1 | 8/2002 | Bar-David | |

(Continued)

*Primary Examiner*—Vivian Chin
*Assistant Examiner*—Lun-See Lao
(74) *Attorney, Agent, or Firm*—Wood, Herron & Evans, LLP

(57) ABSTRACT

A feed-forward amplifier includes a main amplifier having input signals and amplified output signals and an error amplifier for amplifying distortion signals to be added to the amplified output signals of the main amplifier to produce an amplifier output. A pilot tone modulation and recovery circuit modulates a pilot tone to be coupled to the input signals of the main amplifier and recovers the pilot tone from the amplifier output. The pilot tone modulation and recovery circuit includes a digital filter and a signal source. The signal source is used to both modulate the pilot tone and control the digital filter for recovering the pilot tone.

34 Claims, 2 Drawing Sheets

U.S. PATENT DOCUMENTS

| | | |
|---|---|---|
| 6,452,446 B1 | 9/2002 | Eisenberg et al. |
| 6,466,092 B2 | 10/2002 | Kusunoki |
| 6,492,867 B2 | 12/2002 | Bar-David |
| 6,496,062 B1 | 12/2002 | Nitz et al. |
| 6,525,603 B1 * | 2/2003 | Morgan ................... 330/52 |
| 6,531,918 B1 | 3/2003 | Posner et al. |
| 6,566,948 B1 | 5/2003 | Braithwaite |
| 6,573,792 B1 | 6/2003 | Olson et al. |
| 6,573,793 B1 | 6/2003 | Gutierrez |
| 6,600,368 B2 | 7/2003 | Kim |
| 6,614,854 B1 | 9/2003 | Chow et al. |
| 6,624,694 B2 | 9/2003 | Ma et al. |
| 6,734,731 B2 | 5/2004 | Cavers et al. |
| 6,734,732 B2 | 5/2004 | Cavers |
| 6,757,570 B1 | 6/2004 | Calise et al. |
| 6,771,125 B2 | 8/2004 | Bingham |
| 6,774,834 B2 | 8/2004 | Dartois |
| 6,791,410 B2 | 9/2004 | Kim et al. |
| 6,831,512 B2 | 12/2004 | Cavers et al. |
| 6,831,519 B2 | 12/2004 | Bar-David et al. |
| 6,853,248 B2 | 2/2005 | Weldon |
| 6,885,694 B1 | 4/2005 | He et al. |
| 6,897,722 B2 | 5/2005 | Cavers |
| 2002/0008579 A1 * | 1/2002 | Mucenieks et al. .......... 330/149 |

* cited by examiner

APPARATUS AND METHOD FOR PROCESSING OF AMPLIFIER LINEARIZATION SIGNALS

FIELD OF THE INVENTION

This invention relates generally to the field of radio frequency (RF) amplifier circuits, and more particularly to RF amplifier linearization techniques.

BACKGROUND OF THE INVENTION

RF amplifier circuits are utilized for a variety of different purposes including RF communication applications, such as cellular telephone and other wireless communication applications. Generally, all practical RF power amplifiers will add unintentional distortion to the signals that they are intended to amplify. To address such undesired signal distortion, various different linearization processes are known and may be used to minimize the distortion. One such linearization process that is commonly used is termed "feed-forward" linearization. Generally, various feed-forward techniques are known to persons of ordinary skill in the art.

A typical feed-forward amplifier topology incorporates a main amplifier located within a carrier cancellation loop of the circuit, and an error amplifier located within a distortion cancellation loop of that circuit. Briefly, an input signal is split with a portion of the signal going to the main amplifier and another portion going along a non-amplified path. The main amplifier then amplifies the signal of interest, but, as noted above, also introduces unintentional distortion to that amplified signal. The unamplified signal portion is then constructively subtracted from the amplified/distorted signal, to effectively cancel the signal of interest and leave only the distortion signal. Since the signal of interest is often an RF carrier signal, the first loop of a feed-forward amplifier is generally referred to as a carrier cancellation loop. The distortion signal that remains from the carrier cancellation loop is then further processed in the distortion-cancellation loop. To that end, in the distortion-cancellation loop, the distortion signals are amplified and then destructively added to the amplified/distorted signal along the main amplifier path in such a way as to effectively remove the distortion, thereby leaving only the amplified signal of interest. In short, in a feed-forward amplifier, the distortion is isolated from the signal of interest and then added back to the main amplified signal in a subtractive sense to effectively remove the distortion from the main signal. Therefore, the second loop that provides the output of the feed-forward amplifier is often referred to as the distortion cancellation loop.

To optimize a feed forward amplifier and its ability to reduce distortion in the amplified signal, a test signal, such as a pilot tone, is injected at the input to the main amplifier. The pilot tone is generated by a local oscillator (LO) and modulated using a modulation source and a mixer. The injected pilot tone represents unintentional distortion generated by the main amplifier. To optimize the linearization process, the linerarization circuit, and settings therein, are optimized so that the injected pilot tone is minimized or eliminated at the output of the feed-forward amplifier.

Optimization is typically accomplished by sampling the RF output and then demodulating the injected pilot tone to isolate the pilot tone. Usually, the same local oscillator (LO) is used in the demodulation process to guarantee proper alignment of the demodulation carrier and to recover the pilot tone with the same frequency and characteristics as the original modulation source. The demodulated pilot tone is then filtered by a band pass filter to isolate the pilot tone and remove any other additional undesired signals. The filtered pilot tone, which represents the distortion that still exists, is then amplified and detected to produce gain and phase control signals that are proportional to the level of the detected pilot tone. Those gain and phase control signals are then used to control the input to the error amplifier, and thus minimize the pilot tone. In that way, the amplification process between the input and the output of the feed-forward amplifier becomes more linear as the level of the pilot tone that is measured by the detector is minimized.

As such, the ability to discern the pilot tone level in the detector circuit limits the extent of the linearization process. As such, the quality of the linearization utilizing the pilot tone signal as a test signal depends upon the dynamic range of the detected pilot tone that is sampled from the RF output and the signal-to-noise ratio of the detected pilot tone signal to the background noise in the detector. In a typical feed-forward optimization scheme, analog filtering techniques are employed and implement band pass filter elements to eliminate all signals other than the pilot tone signal that is sampled from the RF output. For such optimization it is desirable to use a very narrow band pass filter to eliminate all other extraneous signals other than the pilot tone that is sampled from the output in order to achieve better signal-to-noise ratio and greater dynamic range of the output pilot tone sample. The linearization process functions to continually reduce the amplitude of the pilot tone until it is indiscernible from background noise. That is why narrow band filtering is very important. In such filtering, a compromise occurs between the filter band of the filter device and the filter center frequency value.

More specifically, the Quality factor of a filter (Q-factor) is commonly used to describe the ratio of band width to center frequency for that filter. A narrow band pass filter (high Q) requires very high tolerance component values to keep the narrow band width filter aligned to the pilot tone sample frequency. However, practical limits on component costs and reproducibility restrict the value of Q to around 10. In a typical system, dynamic range considerations require an absolute bandwidth on the order of 100 Hz. If Q is limited to 10, the center frequency will be on the order of 1 kHz. At this frequency, typical LC filters have various drawbacks. For example, they are bulky, expensive, microphonic and are subject to drift. Active filters might be utilized. However, narrow bandwidth active filters are generally quite noisy.

As such, implementing band pass filters with high Q values will result in center frequency drift which affects the pilot tone amplitude. With an improperly centered band pass filter that varies as component values change with temperature, the pilot amplitude variation is interpreted as a change in the linearization metric for the feed-forward amplifier, and, therefore, an undesired operation of the linearization control loop. On the other hand, band pass filters that are implemented with a low Q will remain properly aligned to the output pilot tone sample; however, they will lack dynamic range and have a worse signal-to-noise ratio which limits the quality of the linearization to only modest levels.

Accordingly, it is desirable to improve the operation of feed-forward amplifiers and more specifically, to improve the linearization process for optimizing such feed-forward amplifiers. Still further it is desirable to address the filtering shortcomings associated with the prior art which limit the quality of the linearization process and thus limit the overall optimization and operation of the feed-forward amplifier.

These concerns, and others are addressed by the present invention as set forth in more detail below.

BRIEF DESCRIPTION OF THE DRAWINGS

The accompanying drawings, which are incorporated in and constitute a part of this specification, illustrate components and embodiments of the invention and, together with the detailed description of the embodiments given below, serve to explain the principles of the invention.

DETAILED DESCRIPTION

Figure 1:
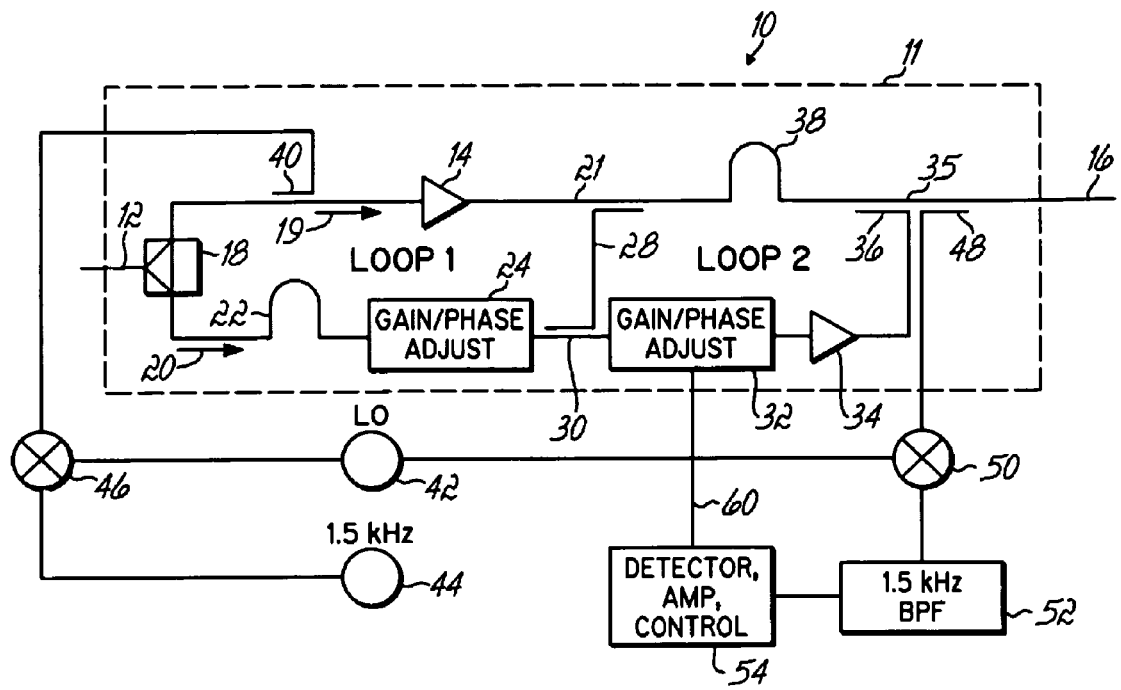
FIG. 1 illustrates a block diagram of a conventional feed-forward amplifier with linearization components.

In illustrating the present invention, it is helpful to understand a standard feed-forward amplifier topology. To that end, FIG. 1 illustrates a simplified block diagram of a conventional feed-forward amplifier 10. An input signal to be amplified is applied at an input terminal 12. Generally, the input signal will be an RF signal, such as a communication signal for a wireless device (e.g., cellular telephone). One or more main amplifier stages are indicated by main amplifier 14. The input signal 12 is amplified then output as an amplified output signal 16. The feed-forward design is well known to those of ordinary skill in the art. Generally the first loop or loop one is indicated as a carrier cancellation loop because the main carrier is canceled in a portion of the loop, leaving essentially distortion from the main amplifier 14. More specifically, the input signal 12 is split by a splitter 18 to proceed along the main path 19 to the main amplifier 14 and also along a non-amplified path 20. For example, a carrier signal that is part of the input signal 12 proceeds along main path 19 and is amplified by the main amplifier 14 to produce an amplified carrier signal along with the distortion that is inherent, yet unintentional, in the main amplifier. As such, at point 21 along main path 19 the amplified carrier and distortion are present. In path 20, a suitable delay element 22 is utilized to align the signals in time in the respective paths 19 and 20. As may be appreciated, the signal in path 20 does not include distortion, but rather is essentially the input signal, such as a carrier signal. A gain and phase adjust circuit 24 may be utilized to adjust the signal along path 20 for proper carrier cancellation, with the the metric used in the adjustment of gain/phase adjust circuit 24 being the level of carrier cancellation achieved at point 30. A portion of the amplified signal at point 21 is coupled by a suitable coupling device 28 and thus includes both the desired signal, such as the carrier signal, and the distortion from the amplifier 14. At point 30, the coupled amplified signal is combined with the non-amplified carrier signal from path 20 such that the carrier signals cancel leaving only the distortion signals for loop 2. Loop 2 is often considered a distortion cancellation loop and further processes the distortion signals which result from the carrier cancellation at point 30 from loop 1. Using a gain/phase adjust circuit 32 and an error amplifier 34 the distortion signals are processed for being added back to the main amplifier path 19 after being adjusted in gain and/or phase in circuit 32 and amplified. The error amplifier is a linear amplifier typically run as class A such that it does not add its own distortion to the correction signal. That is, the signal at point 30 provides an input to the error amplifier 34 that is adjusted in gain and/or phase. The processed and amplified distortion signals are then combined onto line 16 at point 35 by an appropriate coupler circuit 36 with a delayed version of the main amplifier output 21. The delayed version is appropriately delayed by a suitable delay element 38. The second signal combination at point 35 is done subtractively and ideally cancels or significantly reduces the distortion component in the main amplifier output thereby leaving the desired amplified signal with reduced distortion. There will also be some reduction (cancellation) of the desired signal at point 35 because the carrier cancellation at point 30 will not be 100%. The part that of the carrier that remains is amplified by amplifier 34 and thereby subtracted from the desired signal at point 35 when the distortion element is removed.

As discussed above, to linearize the feed-forward amplifier circuit 10 in a conventional manner, a pilot tone is injected into the input of the main RF amplifier 14 using an appropriate directional coupler circuit 40. The pilot tone is generated by a local oscillator (LO) 42. The LO signal 42 is then modulated via a modulation source 44, which is shown in FIG. 1 as a 1.5 kilohertz source. In one embodiment, such modulation is single-sideband suppressed carrier modulation which generates a pilot tone that is offset from the LO signal. In other embodiments another modulation scheme might be utilized. The LO signal 42 and modulation signal 44 are provided to an appropriate mixer element 46. The mixed signal that includes the pilot tone is then injected by coupler 40 into the main amplifier path 19.

In theory, the pilot tone represents unintentional distortion that is generated by the main amplifier 14. The linearization process then proceeds to minimize or, in effect, eliminate the injected pilot tone at the output signal 16 of amplifier 10. This is typically accomplished by sampling the RF output signal 16 with an appropriate directional coupler 48 and demodulating the injected pilot tone signal. The demodulation process is generally known in the art and will commonly utilize the same LO 42 that is used to generate the modulated pilot tone signal that is injected to the main amplifier path 19 via coupler 40. Utilizing the same LO signal 42 guarantees proper alignment of the demodulation carrier to effectively recover the modulation imposed on the pilot tone signal with the same frequency and characteristics as the modulation signal source 44 utilizing an appropriate mixer circuit 50. The demodulated pilot tone signal is then filtered by a band pass filter (BPF) 52 to remove any other signals other than the pilot tone signal. The filtered pilot tone signal is then amplified and detected by appropriate circuit components. The detected signal is then used to produce gain and phase control signals 60 to control the gain/phase adjust circuit 32 for the feed-forward amplifier 34 and thereby reduce the pilot tone level that is in the output signal 16 and measured by the amplifier/detector circuit 54. The amplification process between the input signal 12 and the output signal 16 then becomes more linear as the level of the pilot tone signal that is measured by the amplifier/detector circuit 54 is minimized. As noted above, it is desirable to utilize a very narrow band pass filter 52 to eliminate all other extraneous signals other than the pilot tone that is sampled from the output signal 16. This achieves better signal to noise ratio and greater dynamic range in the output pilot tone sample thus would improve the quality of linearization. However, suitable analog filtering techniques require filters that are bulky, expensive, microphonic, and subject to drift. Narrow bandwidth active filters are generally noisy. Such characteristics of the filters affect the linearization control loop. Accordingly, the present invention addresses such shortcomings and problems associated with the prior art.

Figure 2:
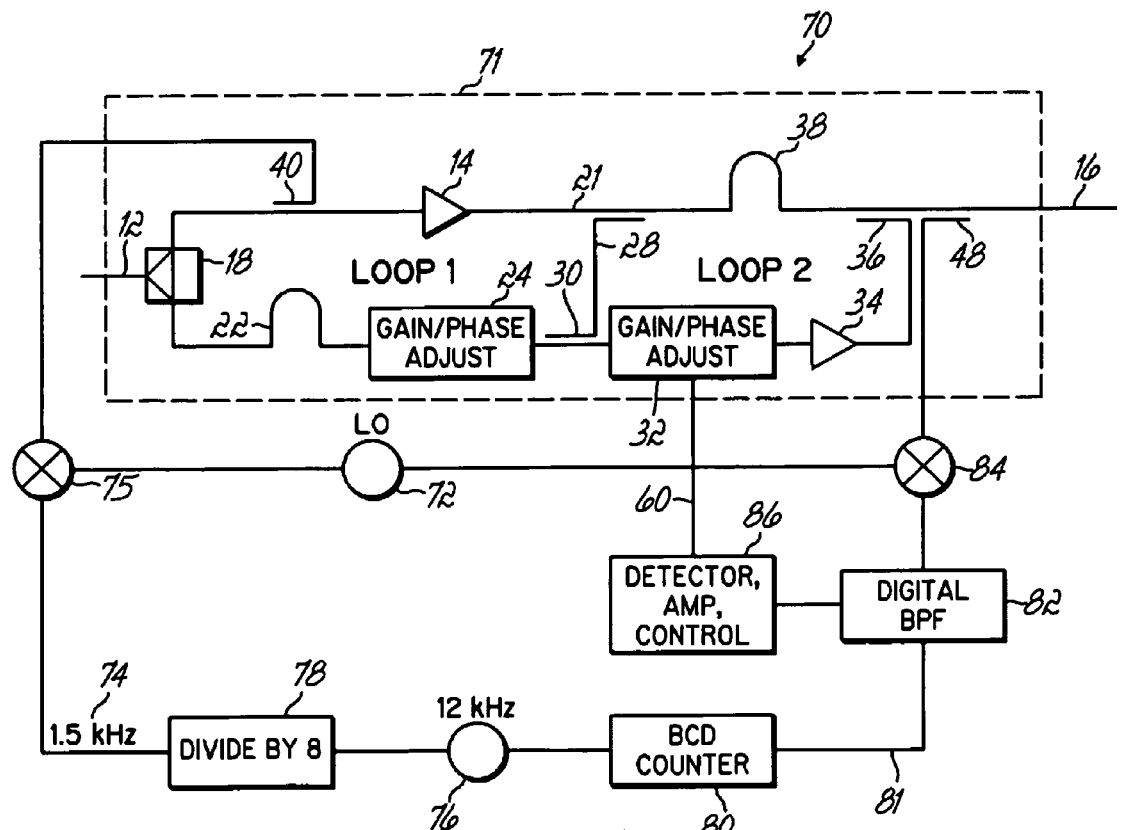
FIG. 2 illustrates a block diagram of a feed-forward amplifier incorporating one embodiment of the invention.

FIG. 2 shows a block diagram of one embodiment of the present invention. A feed-forward amplifier 70 utilizes a typical feed-forward amplifier design similar to that shown in FIG. 1 and designated by the dashed line block 71 in FIG. 2. Similar reference numerals are used where appropriate. That is, the feed-forward amplifier 70 incorporates a first loop or carrier cancellation loop which includes main amplifier 14 and a second loop or distortion cancellation loop which includes the error amplifier 34. The present invention is incorporated within the pilot tone modulation and recovery circuit portion of the overall amplifier circuit indicated in FIG. 2. More specifically, the amplifier circuit 70 of FIG. 2 utilizes digital filtering of the RF amplifier linearization signals, such as a pilot tone signal, to address the shortcomings of the prior art as noted above. The various circuit components of the pilot tone modulation and recovery circuit interface with feed-forward amplifier to linearize its output. Specifically, an LO 72 provides a pilot tone signal that is then modulated by a 1.5 kHz signal 74 via a mixer or modulator 75. However, rather than utilizing a 1.5 kHz signal source, such as source 44 in FIG. 1, the modulating signal 74 is derived from another signal source that is also used elsewhere in the circuit. Signal 74 is derived by dividing the signal from a 12 kHz signal source 76 utilizing a divider circuit, such as a divide-by-8 counter 78 in order to produce the 1.5 kHz modulating signal for the present invention. Simultaneously, the 12 kHz signal source 76 is also used to operate a binary counter 80 or a Binary Coded Decimal (BCD) counter employing states 0 through 7. The counter signals 81 from the binary counter 80 are used to operate a digital band pass filter (BPF) 82. Therefore, in accordance with one aspect of the invention, a common 12 kHz signal source 76 provides the basis for modulation for the pilot tone generation as well as operation of the filter responsible for recovering the modulated pilot tone from the RF output 16.

In one aspect of the invention utilizing a common 12 kHz signal source 76 to modulate the pilot tone and also to operate the digital band pass filter guarantees synchronization of the pilot tone center frequency regardless of the digital filter band width. As such, the guaranteed alignment of the bandwidth of the band pass filter 82 about the center frequency allows for a very narrow filter bandwidth (high filter Q) to be employed. Such a narrow filter band width and high filter Q might be utilized without the performance degradation associated with component value variations that occur from part-to-part in a filter or that occur due to temperature effects as noted above with respect to the prior art and conventional feed-forward optimization schemes.

The injected pilot tone signal is sampled from the RF output 16 by coupler 48 and demodulated via the mixer 84 and the common LO signal 72 to recover the modulation imposed upon the pilot tone. The recovered signal from the sampled and demodulated pilot tone is then filtered by the digital band pass filter 82 and provided to suitable detector, amplifier, and control circuitry 86 to provide gain-phase control signals, 60, to control gain-phase adjust circuit 32 within the distortion cancellation loop of the feed-forward amplifier 70.

While the detector/amplifier/control circuit 86 is illustrated schematically as one block, it might also be provided by two, three or more separate components which provide those various functions of amplification, detection, and control signal generation. Therefore, for this and other reasons, the present invention is not limited to the illustrated embodiments and the functional circuit blocks shown.

Therefore, the present invention provides a straightforward and cost effective method for filtering linearization signals which overcomes the shortcomings associated with the prior art. Specifically, a single modulating signal source is used to modulate the pilot tone injected into the input of the amplifier to be linearized and is also used as the basis for recovery and processing of the modulated pilot tone that is sampled from the output of the linearized amplifier. Utilizing a common signal source to perform both functions results in the ability to discern the pilot signal over a greater dynamic range and with better signal-to-noise ratios than prior art systems as well as ignore extraneous signals in the vicinity of the pilot tone. This produces a feed-forward amplifier that has superior linearization than has previously been possible. Controlling both the pilot tone modulation and a digital filter circuit with a common modulating signal source guarantees synchronization of the filter center frequency and the pilot tone to achieve such superior linearization.

Figure 3:
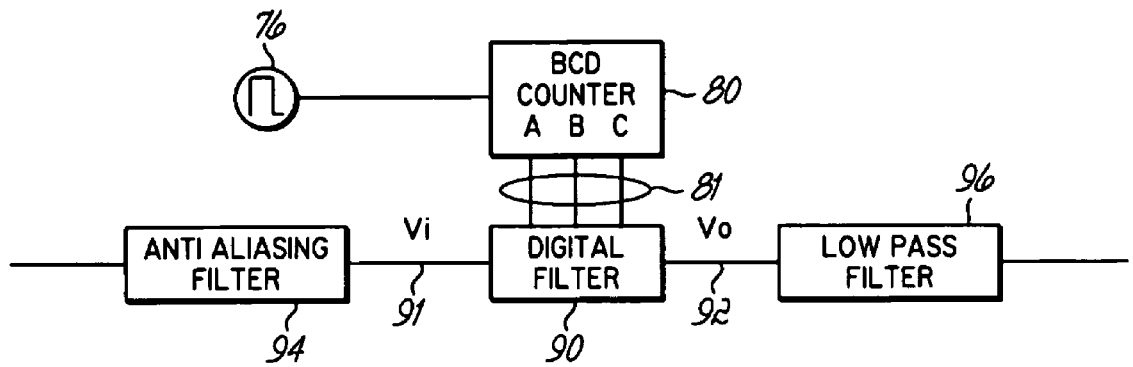
FIG. 3 is a block diagram of an embodiment of a digital filter function implemented in hardware in accordance with one embodiment of the invention.

FIG. 3 is a block diagram illustrating one embodiment for a circuit for implementing the digital filter function of digital band pass function 82. The digital filter 90 has an input $V_i$, such as from the sampled RF output demodulated via mixer 84 (see FIG. 2). Filter 90 also has an output $V_o$ 92 which would be directed to the detector, amplifier, and control circuit 86. The recovered modulation imposed upon the pilot tone signal as demodulate by mixer 84 passes through an anti-aliasing filter 94 prior to the processing by digital filter 90. The anti-aliasing filter 94 band limits the input signal bandwidth applied to the digital filter 90 to the desired signal frequency, 1.5 kHz in this case, to avoid aliasing as is well known to those skilled in the art of digital signal processing. The filtered signal $V_o$ is directed to a low pass filter 96 before being made available to circuit 86. A clock oscillator, such as the 12 kHz signal from signal source 76 is utilized to run the binary counter 80 that controls the digital filter 90 via a series of control lines 81. That is, the signal source 76 is also used for controlling BPF 82 by running the binary counter 80.

Figure 4:
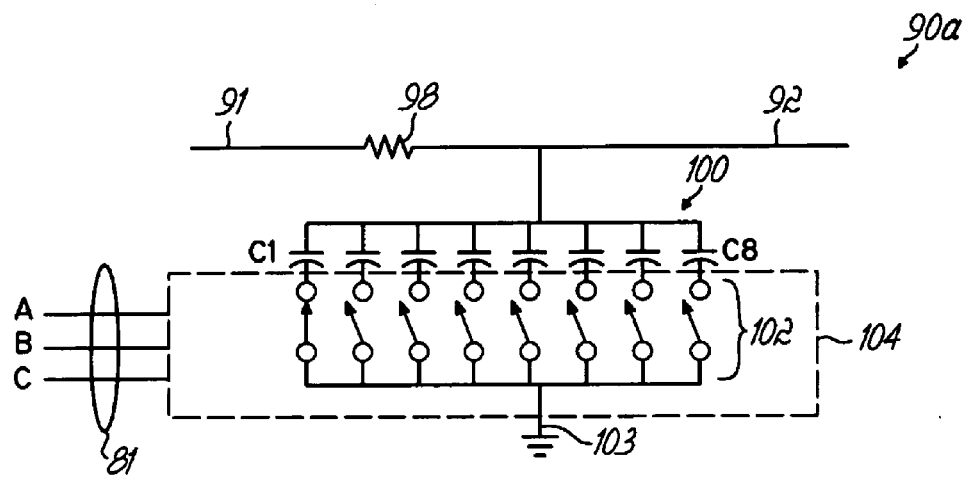
FIG. 4 is a schematic diagram of a digital filter circuit in accordance with one embodiment of the invention.

FIG. 4 further illustrates a circuit schematic of one embodiment of a digital filter 90 that may be implemented in hardware easily and cost effectively without the need for specific precision-tolerance components as would be required in previous linearization circuits or complex Digital Signal Processor (DSP) and associated DSP software/firmware development necessary to implement the digital filtering function. In the filter circuit 90a the input signal 91 to be filtered is applied to an appropriate input filter terminal, as shown in FIG. 4. The filtered output signal 92 is then taken away from an output terminal of the filter circuit 90a. A filtering characteristic for filter circuit 90a is provided by resistor 98 in combination with a capacitor array 100, including a plurality of capacitors C1-C8 along with associated analog switches 102 for the respective capacitors. The control signals 81 from the counter 80 will cause the capacitors C1-C8 to be switched to a ground reference 103 sequentially and one at a time. For this reason, this type of filter is sometimes referred to as a digitally commutated filter. The rate at which each capacitor C1-C8 will be selectively switched to ground depends upon the frequency of the counter coded signals, which are driven by signal source 76. In accordance with one aspect of the invention, those signal frequencies that are applied to the input filter terminal 91 that are equal to ⅛ the rate in which the capacitors C1-C8 traverse one complete sequence, and harmonics thereof, will generally pass through filter circuit 90a to the output terminal 92 with little attenuation. All other signal frequencies that are applied to the input terminal 91 will be greatly attenuated at the output terminal 92. While a BCD sequence is illustrated in FIG. 4 with respect to the switching of capacitors C1-C8, other sequences might also be utilized. For example a Gray code sequence might be utilized. Other sequences might be followed provided each and every capacitor is switched to ground for the same interval of time and before the cycle then repeats beginning with capacitor C1. The switching circuitry indicated as element 104 in FIG. 4 might be implemented utilizing an eight channel analog multiplexer to provide the necessary switching of the capacitors C1-C8.

While FIG. 4 illustrates one hardware embodiment of a digital filter implemented in accordance with the invention, the digital filter circuit 90*a* might also alternately be implemented in software via digital signal processing techniques that would be familiar to those skilled in the art.

Figure 5:
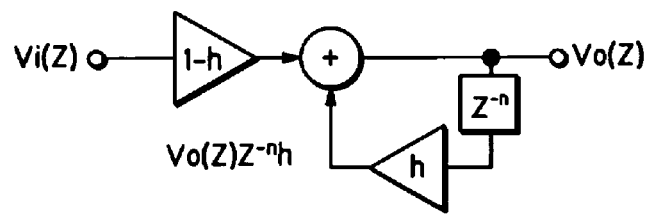
FIG. 5 is a schematic block diagram of a signal flow for a digital filter in accordance with one embodiment of the invention.

FIG. 5 represents a signal flow diagram reflective of the digital filter set forth in FIG. 4. The transfer function of the digital filter in the Z domain familiar to those skilled in the art is set forth by equations 1 and 2 below.

The transfer function in the complex frequency domain is set forth by equations 2 and 3 for the digital filter illustrated in FIG. 4. The filter bandwidth is set forth in equation 4 below.

$$\frac{Vo(Z)}{Vi(Z)} = \frac{1-h}{(1-h \cdot Z^{-n})} = H(Z) \qquad \text{EQ. 1}$$

$$h = e^{-\frac{T}{RCn}} \qquad \text{EQ. 2}$$

$$|H(j\omega)| = \frac{1}{\sqrt{1 - \frac{2 \cdot h}{(1-h)^2} \cdot (1 - \cos n\omega t)}} \qquad \text{EQ. 3}$$

$$BW\ (Hz) = \frac{1}{n \cdot \pi \cdot R \cdot C} \qquad \text{EQ. 4}$$

Where:
BW (Hz) is the bandwidth in Hz
R is the value of resistance
C is the value of capacitance
is 3.1415
n is the order of the filter (number of capacitors)
n$\omega$t=sampling rate In accordance with another aspect of the invention, the bandwidth of the digital filter illustrated in FIG. 4 might be dynamically altered, such as by changing the value of R of the resistor 98 or the value of C of all of the capacitors C1-C8 during operation. For example, resistor 98 might be replace with a variable resistor or potentiometer. In another example, its value might be changed discretely by incorporating several resistors that are connected in series such that resistor elements might be shorted out to become non-active elements using electrode-mechanical means or electronic means such as a bi-directional analog switch. Another related parameter to be dynamically altered is response time. The narrower the filter, the longer the response time. It may be desirable to use a fairly wide filter bandwidth initially to achieve initial distortion cancellation with a rapid response, but limited quality (S/N ratio), then switch to a more narrow filter bandwidth (higher R value) to improve the quality of linearity (S/N ratio of the detected pilot tone) but which slows the response/convergence time)

Thus, while the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept. For example, the exemplary feed-forward amplifier system described herein has focused on digital filters implemented by switching capacitors to ground, aka digitally commutated filter). However, the principles of the present invention are applicable to other digital filters as well.

What is claimed is:

1. A feed-forward amplifier comprising:
a main amplifier loop with a main amplifier having input signals and amplified output signals;
an error amplifier loop having an error amplifier for amplifying distortion signals to be added to the amplified output signals of the main amplifier to produce an amplifier output;
a pilot tone modulation and recovery circuit for modulating a pilot tone to be injected into the input signals of the main amplifier and for recovering the pilot tone from the amplifier output, the pilot tone modulation and recovery circuit including a digital bandpass filter and a signal source;
the signal source being used to both modulate the pilot tone and configure and control the digital bandpass filter for recovering the modulation imposed on the pilot tone.

2. The feed-forward amplifier of claim 1 wherein the error amplifier loop includes a gain/phase adjust circuit for varying a gain and/or phase of distortion signals to be amplified by the error amplifier, the pilot tone modulation and recovery circuit providing control signals for controlling the gain/phase adjust circuit.

3. The feed-forward amplifier of claim 1 wherein pilot tone modulation and recovery circuit includes a divider circuit for dividing a signal from the signal source for modulating a pilot tone.

4. The feed-forward amplifier of claim 3 wherein the divider circuit includes a divider counter.

5. The feed-forward amplifier of claim 1 wherein the pilot tone modulation and recovery circuit includes a counter coupled between the signal source and the digital bandpass filter for configuring and controlling the digital bandpass filter.

6. The feed-forward amplifier of claim 5 wherein the counter is a binary counter.

7. The feed-forward amplifier of claim 1 further comprising a detector circuit, the digital bandpass filter coupled to the detector circuit for providing detection of the modulation imposed upon the pilot tone.

8. The feed-forward amplifier of claim 1 further comprising a detector circuit, the digital bandpass filter coupled to the detector circuit for providing detection of the modulation imposed upon the pilot tone, the detector circuit operable for providing control signals for controlling the gain/phase adjust circuit.

9. The feed-forward amplifier of claim 1 wherein the digital bandpass filter comprises a plurality of capacitors that are selectively switched to a ground reference.

10. The feed-forward amplifier of claim 5 wherein the digital bandpass filter comprises a plurality of capacitors that are selectively switched to a ground reference, the counter controlling the selective switching of the capacitors to selectively configure and control the digital bandpass filter.

11. A feed-forward amplifier with a main amplifier loop that amplifies input signals and produces an amplified output and an error amplifier loop to reduce distortion in the amplified output, the amplifier comprising:
- a pilot tone modulation and recovery circuit including a digital bandpass filter and a signal source;
- the signal source being used to both modulate the pilot tone to be injected into the input signals and to configure and control the digital bandpass filter for recovering the modulation imposed upon the pilot tone from the amplifier output.

12. The feed-forward amplifier of claim 11 wherein pilot tone modulation and recovery circuit includes a divider circuit for dividing a signal from the signal source for modulating a pilot tone.

13. The feed-forward amplifier of claim 12 wherein the divider circuit includes a divider counter.

14. The feed-forward amplifier of claim 11 wherein the pilot tone modulation and recovery circuit includes a counter coupled between the signal source and the digital bandpass filter for configuring and controlling the digital bandpass filter.

15. The feed-forward amplifier of claim 14 wherein the counter is a binary counter.

16. The feed-forward amplifier of claim 11 wherein the digital bandpass filter comprises a plurality of capacitors that are selectively switched to a ground reference.

17. A pilot tone modulation and recovery circuit for use with a feed-forward amplifier to modulate a pilot tone to be injected into input signals to the amplifier and for recovering the modulation imposed upon the pilot tone from an amplifier output, the circuit comprising:
- a digital bandpass filter for coupling to the amplifier output;
- a pilot tone modulator for coupling to the input signals to inject a pilot tone;
- a signal source;
- the signal source being coupled to the pilot tone modulator and digital bandpass filter and used to both modulate the pilot tone and configure and control the digital bandpass filter for recovering the modulation imposed upon the pilot tone.

18. The circuit of claim 17 including a divider circuit for dividing a signal from the signal source for modulating a pilot tone.

19. The circuit of claim 18 wherein the divider circuit includes a divider counter.

20. The circuit of claim 17 including a counter coupled between the signal source and the digital bandpass filter for configuring and controlling the digital bandpass filter.

21. The circuit of claim 20 wherein the counter is a binary counter.

22. The circuit of claim 17 wherein the digital bandpass filter comprises a plurality of capacitors that are selectively switched to a ground reference.

23. A method of calibrating a feed-forward amplifier that includes a main amplifier loop with a main amplifier having input signals and amplified output signals and an error amplifier loop having an error amplifier for amplifying distortion signals to be added to the amplified output signals of the main amplifier to produce an amplifier output, the method comprising:
- modulating a pilot tone with a signal source and injecting the pilot tone into the input signals of the main amplifier;
- recovering the modulation imposed upon the pilot tone from the amplifier output using a digital bandpass filter;
- using the signal source to configure and control the digital bandpass filter for recovering the modulation imposed upon the pilot tone.

24. The method of claim 23 further comprising dividing a signal from the signal source with a divider for modulating the pilot tone.

25. The method of claim 24 wherein the divider circuit includes a divider counter.

26. The method of claim 23 further comprising configuring and controlling the digital bandpass filter with a counter coupled between the signal source and the digital bandpass filter.

27. The method of claim 26 wherein the counter is a binary counter.

28. The method of claim 23 wherein the digital bandpass filter comprises a plurality of capacitors, the method further comprising selectively switching the capacitors to a ground reference.

29. A method of controlling a circuit that is responsive to an input and generates an output, the method comprising:
- modulating a pilot tone with a signal source and injecting the modulated pilot tone into the input of the circuit;
- sampling the output of the circuit that is responsive to the input modulated pilot tone;
- recovering the modulation imposed upon the pilot tone from the amplifier output sample using a digital bandpass filter;
- using the signal source to configure and control the digital bandpass filter for recovering the modulation imposed upon the pilot tone for controlling the circuit.

30. The method of claim 29 further comprising dividing a signal from the signal source with a divider for modulating the pilot tone.

31. The method of claim 30 wherein the divider circuit includes a divider counter.

32. The method of claim 29 further comprising configuring and controlling the digital bandpass filter with a counter coupled between the signal source and the digital bandpass filter.

33. The method of claim 32 wherein the counter is a binary counter.

34. The method of claim 29 wherein the digital bandpass filter comprises a plurality of capacitors, the method further comprising selectively switching the capacitors to a ground reference.

* * * * *